United States Patent [19]

Glang et al.

[11] Patent Number: 4,871,684

[45] Date of Patent: Oct. 3, 1989

[54] SELF-ALIGNED POLYSILICON EMITTER AND CONTACT STRUCTURE FOR HIGH PERFORMANCE BIPOLAR TRANSISTORS

[75] Inventors: Reinhard Glang, Reston, Va.; San-Mei Ku, Poughkeepsie, N.Y.

[73] Assignee: International Business Machines Corporation, Armonk, N.Y.

[21] Appl. No.: 114,190

[22] Filed: Oct. 29, 1987

[51] Int. Cl.[4] ........................................ H01L 21/265
[52] U.S. Cl. ..................................................... 437/31
[58] Field of Search ........................................ 437/31

[56] References Cited

U.S. PATENT DOCUMENTS

| | | | |
|---|---|---|---|
| 3,997,367 | 12/1976 | Yau | 437/31 |
| 4,431,460 | 2/1984 | Barson et al. | 148/1.5 |
| 4,483,726 | 11/1984 | Isaac et al. | 148/187 |
| 4,495,512 | 1/1985 | Isaac et al. | 357/34 |
| 4,619,036 | 10/1986 | Havemann et al. | 437/31 |
| 4,671,851 | 6/1987 | Beyer et al. | 156/145 |
| 4,713,355 | 12/1987 | Gardner | 437/31 |
| 4,717,686 | 1/1988 | Jacobs et al. | 437/31 |

OTHER PUBLICATIONS

IBM Technical Disclosure Bulletin, vol. 27, No. 8, Jan. 1985, pp. 4899-4902, Chu et al.
IBM Technical Disclosure Bulletin, vol. 24, No. 7A, Dec. 1981, pp. 3424-3426, Barson et al.
IBM Technical Disclosure Bulletin, vol. 24, No. 10, Mar. 1982, pp. 5128-5131, Magdo et al.
IEDM85 Conference Proceeding, pp. 688-691.
Solid State Technology/Sep. 1982, Internation Report at p. 24, Selma Uslaner, Managing Editor.

Primary Examiner—Donald L. Walton
Attorney, Agent, or Firm—Joseph C. Redmond, Jr.

[57] ABSTRACT

A semiconductor process for fabricating bipolar devices of one type and extendible to include bipolar devices of a second type in the same epi-layer. The process protects selected surfaces of the epi-layer against deleterious processes associated with the formation of future emitter/contact regions for the devices. Subsequently, such emitter/contact regions are formed beneath such protected surfaces and contribute to enhanced device performance. The process also provides improved planarization of an insulating layer on the epi-layer by chemical-mechanical polishing. The planarization in conjunction with a mask formed in the insulating layer facilitates the formation of self-aligned emitter/base regions to appropriate thicknesses for high performance devices.

14 Claims, 4 Drawing Sheets

SELF-ALIGNED POLYSILICON EMITTER AND CONTACT STRUCTURE FOR HIGH PERFORMANCE BIPOLAR TRANSISTORScl

BACKGROUND OF THE INVENTION

1. Technical Field

This invention relates to semiconductor devices and more particularly, to improvements in the process for fabricating high performance semiconductor devices.

2. Background Art

In the prior art, high performance semiconductor devices, as shown for example in U.S. Pat. No. 4,431,460 entitled "Method of Producing Shallow, Narrow-Based Bipolar Transistor Structures Via Dual Implantations of Selected Polycrystalline Layers"; Ser. No. 355,633, filed Mar. 8, 1982 and assigned to the assignee of the present invention, are processed in a sequence of steps whereby the extrinsic base is formed before a poly emitter structure. This sequence has a significant disadvantage insofar as the surface physics of the device are concerned. In particular, the emitter surface is exposed to a variety of potentially contaminating or damaging process steps. Among the most damaging, is a reactive ion etching (RIE) step during which the future emitter surface is exposed to ion bombardment and deposition of films of hydrocarbons and heavy metals. These conditions require the insertion of elaborate cleaning steps such as oxidation in oxygen plasma, cleaning in hot oxidizing acids, surface conditioning by wet etching, growth of sacrificial oxide films, and oxide removal in dilute solutions of hydrofluoric acid. In addition, the need to overetch during the RIE step and subsequent sacrificial oxide growth recess the emitter surface below that of the surrounding base junction which makes control of the impurity concentration at the emitter-based junction more difficult. The process steps needed to restore a clean and undamaged surface add complexity and process time to fabricating sequences which are already long and expensive. Moreover, the restored surfaces have been found not to produce contact resistances as low as are obtained on surfaces that have never been exposed to RIE conditions.

It is also known to fabricate a high performance polysilicon base and emitter structure by depositing or forming a surface protective layer of polysilicon or other material for an emitter before forming an extrinsic base whereby such layer serves to protect the subsequently formed emitter region. See, for example, a publication entitled "Self-Aligning Polysilicon Base and Emitter Transistor", by S. F. Chu, B. Hwang and W. Hwang, published in the IBM Technical Disclosure Bulletin, dated Jan. 19, 1985, at pages 4899 through 4902. The Chu et al. process, however, does expose the surface of the crystal contiguous to the emitter area to RIE damaging. Also, the process of interconnecting the extrinsic and intrinsic base of the transistor is complicated, tolerance limited and prone to faulty or lack of interconnection between these two areas of the base region. Further, the degree of planarity required for high performance devices is not achieved in the Chu et al. process which has a photoresist or polyimide covering etched by processes which are not readily controllable.

OBJECTS OF THE INVENTION

An object of the invention is a high performance bipolar device that has improved performance through an enhanced emitter or contact surface which has not been subject to deleterious process steps.

Another object is a process for fabricating a bipolar device to protect a surface against deleterious processes and subsequently form a selected active region under such surface after other active regions of the device have been formed.

Another object is a planarization and self-aligned masking sequence for fabricating emitter/base regions to controllable thicknesses appropriate for high performance bipolar devices.

Still another object is an integrated process for fabricating the NPN and PNP devices in which selected surfaces of the devices are protected against deleterious processes while forming active regions of the device.

SUMMARY OF THE INVENTION

These and other objects, features and advantages of the invention are achieved by a process in which a polysilicon layer which subsequently becomes an emitter structure, either N or P-type, is deposited before an extrinsic base is formed, whereby the sensitive monocrystal emitter surface is never exposed to RIE.

The process for forming an NPN transistor includes the step of depositing successive layers of undoped polysilicon and silicon nitride to appropriate thicknesses. A photoresist masking step patterns the layers to define future emitter regions. The patterned layers of silicon nitride and polysilicon protect the future emitter regions against subsequent process steps for forming an extrinsic base regions and an intrinsic base. An etching process, typically, RIE, exposes the surface of the crystal outside the protected emitter regions. A thermal oxide is grown on the exposed crystal surface through which a first boron implant is made in the crystal to serve as a link up or interconnection between a future extrinsic and intrinsic base regions. A chemical vapor-deposited layer of silicon oxide is deposited, patterned and etched to form sidewalls about the juxtaposed nitride and polysilicon layers protecting the future emitter regions. A second layer of polysilicon, either intrinsic or in situ-doped, is formed across the surface of the crystal and planarized by a chemical-mechanical polishing process using the nitride areas as polishing stops. The silicon dioxide sidewalls are exposed and serve as self-aligned masks for the subsequent formation of extrinsic/base regions. The planarized polysilicon is oxidized and, if intrinsic, an implant is made into the polysilicon which diffuses into the underlying epi-layers to form an extrinsic base region after a drive-in heat cycle. If the planarized polysilicon is doped only, a drive-in cycle is required to form the extrinsic base region. The nitride layer is etched out and a third boron implant is made into the first polysilicon layer. A drive-in cycle is performed to establish an intrinsic base region. The intrinsic base is connected to the extrinsic base through the link-up or interconnection diffusions made in the first boron implant. An arsenic or phosphorus implant is made in the first polysilicon and a drive-in cycle is employed to out-diffuse the dopant partially into the intrinsic base region as an emitter. The process is completed by forming openings in the oxide to contact the base and collector regions. A layer of metallization is deposited or otherwise formed to complete the contacts to the device. The wiring pattern is formed by either subtractive etching or by a "lift-off" process.

A compatible vertical PNP (VPNP) may be formed by starting with the same P-type substrate and N epi followed by an implant of boron to produce a P-layer as the collector for the VPNP transistor. Alternatively, a heavily or moderately doped P-type epi-layer may be grown over an N epi, whereby the P-type epi-layer serves as the collector for the vertical PNP. A lightly doped N region (the intrinsic base for VPNP) is formed above the P collector region by ion implanting phosphorus or arsenic into the top P collector region. The process for forming the NPN device is initiated in which the N-type diffusion serves as the contact to the N-type base region of the VPNP and similarly, the emitter region of the VPNP is formed at the time the extrinsic base region is formed for the NPN device.

In Summary, the process of the present invention facilitates the fabrication of NPN and vertical PNP devices by protecting areas or regions in the crystal for subsequently formed emitters and/or base contacts.

DESCRIPTION OF THE BEST MODE FOR CARRYING OUT THE INVENTION

Figure 1A:
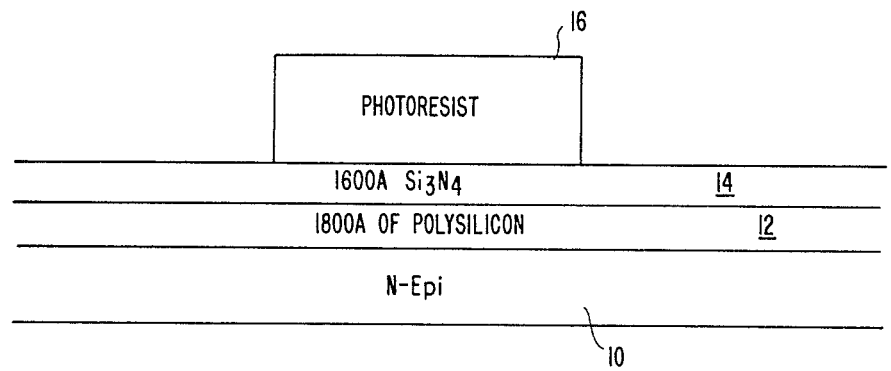
FIGS. 1A through 1G show a sequence of process steps for forming a bipolar NPN transistor.

In FIG. 1A, an N-type epi-layer 10 is shown. The layer 10 may be formed on a P-type substrate having an N+ region (as will be discussed in connection with FIG. 2A) to serve as a subcollector for subsequently formed devices. The process of the invention is initiated by depositing successive layers of undoped polysilicon 12 and silicon nitride 14. The layers 12 and 14 are formed to thicknesses of the order of 1800 angstroms and 1600 angstroms, respectively, although different thicknesses will also work with appropriate modifications in the process. The polysilicon may be deposited at a temperature in the range of 600–700 degrees centigrade at a rate of the order of 100 angstroms per minute. The nitride may be deposited at a temperature in the range of 600–850 degrees centigrade at a rate of 20 angstroms per minute. A photoresist masking step is employed to form patterned photoresist regions 16 which define the area under which emitter regions will be subsequently formed in a bipolar device. The layers 12 and 14 not covered by the patterned resist 16, are removed by a conventional reactive ion etching process. The etch is timed to stop at the surface of the crystal 10. In the event of non-uniform etch rates, removal of a residual polysilicon layer, up to a thickness of 200 angstroms, is acceptable for purposes of the process.

Figure 1B:
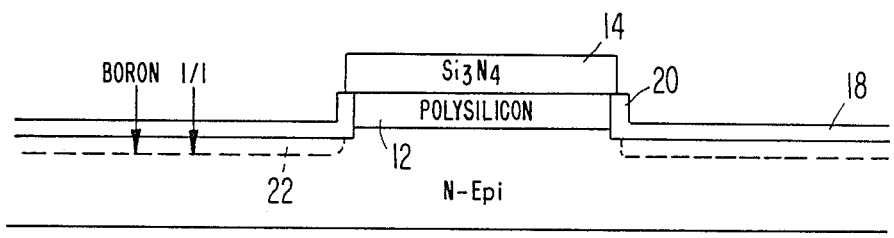

After stripping the resist region 16, the surface of the crystal 10 is thermally oxidized to grow a layer of dioxide 18, as shown in FIG. 1B, to a thickness of 500 angstroms. The edge of polysilicon layer 12 is also converted to silicon dioxide during the oxidation process to form an enclosure 20, surrounding the layer 12. The oxidation takes place at a temperature in the range of 800–1000 degrees centigrade and forms at the rate of 16 angstroms per minute. A first boron implantation is performed through the layer 18. The implant energy and dose is adjusted to yield after all annealing processes, a boron concentration of the order of $10^{18}$ atoms per cc where the emitter and extrinsic base intersect. This interconnection or link-up doping region 22 extends beneath the oxide to serve as a connection between future extrinsic and intrinsic base regions.

Figure 1C:
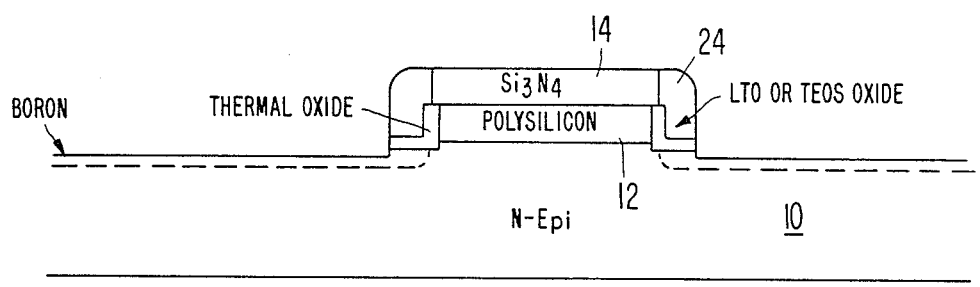

A sidewall 24 is formed about the juxtaposed layers 12 and 14, as shown in FIG. 1C, by chemically vapor depositing silicon dioxide to a thickness of the order of 2,000 to 3,000 angstroms. The chemical vapor process may take place at a temperature in the range of 700–900 degrees centigrade at deposition rates of 12 to 150 angstroms per minute. The silicon dioxide sidewall 24, is formed around the defined polysilicon $Si_3N_4$ region by reactive-ion-etching. The plasma conditions are so chosen as to attack the silicon dioxide at a significantly faster rate than the silicon in the crystal 10. This dielectric sidewall 24, provides self-aligned, precise, narrow spacing between future extrinsic base and emitter-intrinsic base regions. The etching process, however, results in the surface of the crystal adjacent to the sidewall 24 being at a lower level than the surface of the interface between layers the 12 and the crystal 10. This step like feature facilitates both the formation of thin emitter base regions and the extrinsic-intrinsic base interconnection, as will become more apparent hereinafter.

Figure 1D:
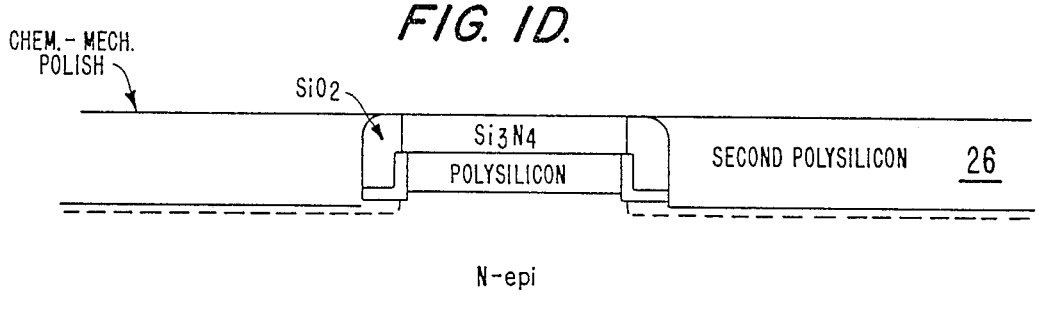

In FIG. 1D, a second polysilicon layer 26 is vapor deposited to a thickness of approximately 3,000 to 4,000 angstroms. The layer 26 may be either intrinsic or in situ-boron doped to solid solubility. The layer 26 is planarized by chemical-mechanical polishing and the nitride regions 14 serve as polishing stops. A typical polishing process is described in U.S. Pat. No. 4,671,851 issued June 9, 1987; pending U.S. applications Ser. Nos. 791,860 and 791,887, 4,789,648 both filed Oct. 28, 1985, all assigned to the same assignee as that of the present invention.

Figure 1E:
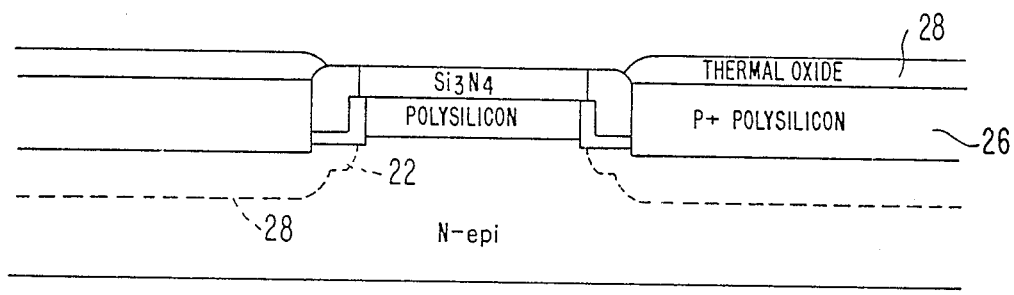

In FIG. 1E the layer 26 is thermally oxidized to form a layer 28 to a thickness of 1,000 to 1,500 angstroms. If the layer 26 was intrinsic, then a second boron implant of about $10^{15}$ atoms per square centimeter is required. Depending on the desired depth and lateral diffusion for an extrinsic base 29, including the link-up or interconnecting layer, a separate drive-in diffusion may be required. If omitted, the extrinsic base 29 receives the same drive-in as the intrinsic base later in the process, but it will diffuse deeper because of the higher boron concentration at the silicon interface.

Figure 1F:
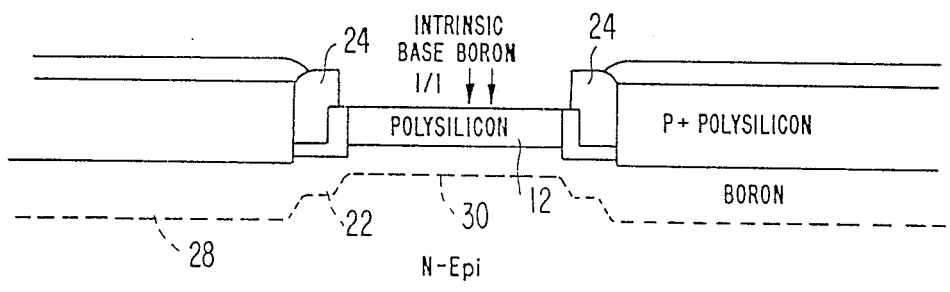
Figure 1G:
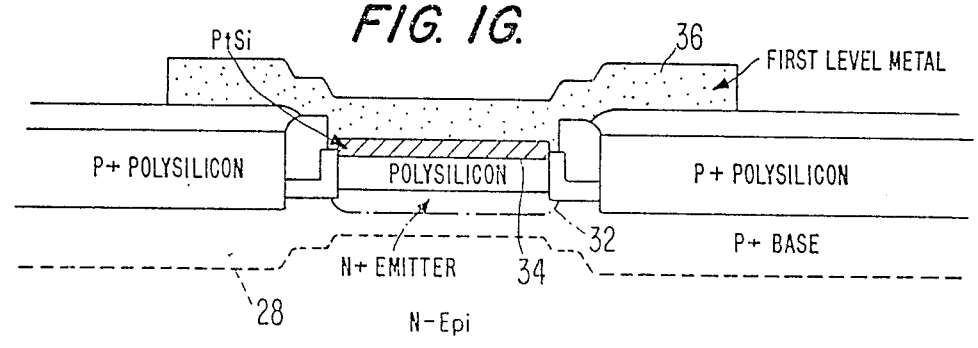

In FIG. 1F, the silicon nitride region 14 is etched away by a hot, phosphoric/nitric acid process to expose the polysilicon layer 12 under which an intrinsic base region will be formed. A third boron implant is performed at a dosage of about $2 \times 10^{14}$ atoms per centimeter square. This is a low-energy implant such that the entire boron stays in the polysilicon layer 12. A diffusion is performed at a temperature around 900 degrees centigrade to diffuse the boron into the single crystal 10 as an intrinsic base 30 which connects to the extrinsic base 29 through the interconnect 22. An arsenic dosage of $2 \times 10^{16}$ per square centimeter is implanted again in the layer 12 to change the conductivity type from P-type to N+. The energy level for the dosage is selected to be low enough to avoid implanting the arsenic into the underlying crystal 10. A drive-in cycle is performed for about twenty minutes at 880 degrees centigrade in nitrogen to diffuse the arsenic into the crystal to form an emitter region 32, as shown in FIG. 1G. The implantation of the emitter and base regions through the self-aligned mask formed by the sidewall 24 facilitates the doping of these regions to controllable thicknesses in appropriate ranges for high performance bipolar devices.

The device fabricated by the described process has an intrinsic base 30 at a higher vertical level than the extrinsic base 29. The interconnecting or link-up region 22 facilitates the interconnection between the extrinsic and intrinsic base regions. The region 22 makes unnecessary the removal of sidewall 24 to implant a link-up or interconnection path, as has been done in the prior art. Such additional processing step exposes the crystal to deleterious etching processes and because of the lack of precise control, offers the possibility of etching beneath the surface of the crystal to lessen or open the required interconnection between the base regions.

In FIG. 1G, the process may be completed by another photoresist masking step to open base, collector and to form Schottky barrier diode contacts, if so desired. Subsequently, a thin platinum film 34 is either evaporated or sputtered to form platinum silicide over the bare silicon in the device contact regions. The unreached platinum over the silicon dioxide is etched off in aqua regia. A first level aluminum wiring pattern 36 is formed, either by subtractive etching or by a lift-off process, to complete connections to the device.

Figure 2A:
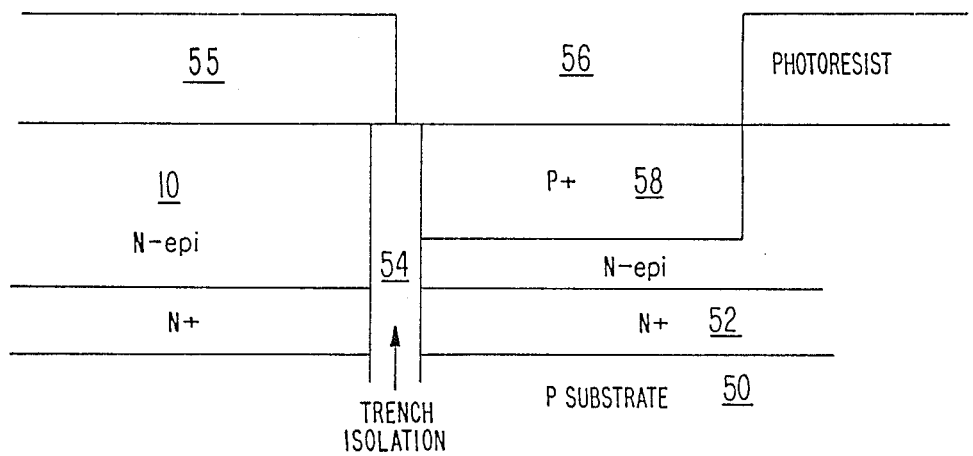
FIGS. 2A and 2B show a series of process steps, compatible with the process steps of FIGS. 1A through 1G, to integrate a vertical PNP device with the NPN transistor.
Figure 2B:
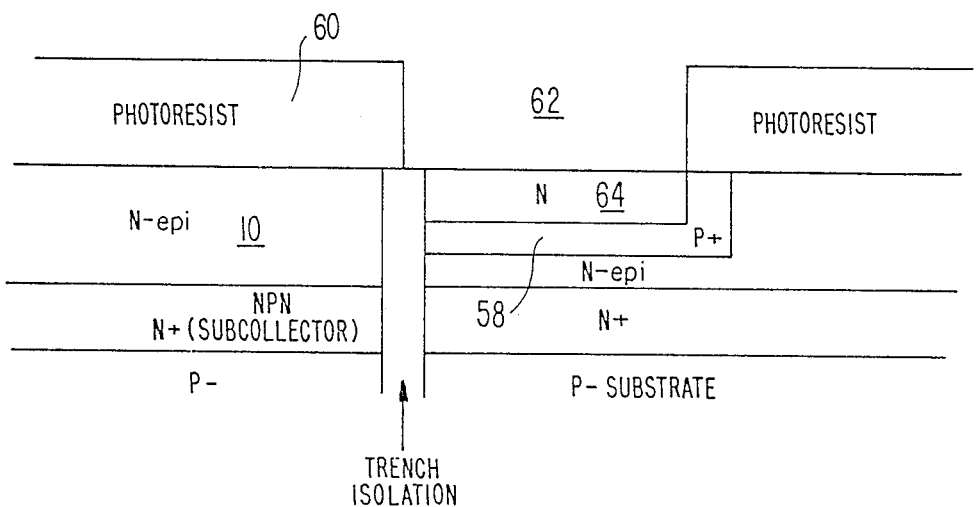

To form a vertical PNP device in the same crystal with the NPN device described in FIGS. 1A through 1G, the following preliminary steps are required before formation of the NPN device. In FIG. 2A, the N− epi-layer 10 is grown on a P-substrate 50 with an N+ layer 52. Trench isolation regions 54, are established to isolate the NPN and vertical PNP devices. The formation of such regions is well known in the prior art. Alternatively, other isolation may be employed in the crystal. A photoresist layer 55 is formed across the surface of layer 10 and patterned to define openings 56. A boron ion implant is made in the opening 56 to serve as a P+ collector region 58 for the vertical PNP device. The photoresist layer 55 is removed and a second layer of photoresist 60, as shown in FIG. 2B, is deposited on the surface of the layer 10 and patterned to form openings 62. A phosphorus or arsenic implant is made through the openings 62 to create a lightly doped N intrinsic base region 64 above the P+ collector region 58. A typical dosage of phosphorus ions is about $4 \times 10^{13}$ per square centimeter at 130 Kev. In order to avoid inversion near the surface, a second phosphorus dosage of $4 \times 10^{13}$ per square centimeter at a lower energy in the range of 60–80 Kev may be required.

Following the preliminary process steps, the process steps described in FIGS. 1A–1G are performed to form both the NPN and PNP devices in the same crystal 10. In FIG. 1A, the resist 16 is patterned for the NPN 10 device to define a region for a future extrinsic base 29 (see FIG. 1E) and a region for a future emitter 32 intrinsic base 30 (see FIG. 1F). Simultaneously, the resist 16 is patterned for the PNP device to define a future base contact 66 and emitter 68 (see FIG. 3). The extrinsic base 29 for the NPN device and the emitter 68 for the PNP device are simultaneously formed by the processes described in conjunction with FIG. 1E. The emitter 32 for the NPN device and base contact 66 for the PNP device are simultaneously formed by the processes described in conjunction with FIG. 1F. In connection with the base contact, the low dose boron implant for the intrinsic base of the NPN will be completely compensated by the background phosphorus or arsenic ion implant for the base of the vertical PNP. Thus, the subsequent arsenic implant for the NPN emitter can be used as the base contact for the vertical PNP transistor.

Figure 3:
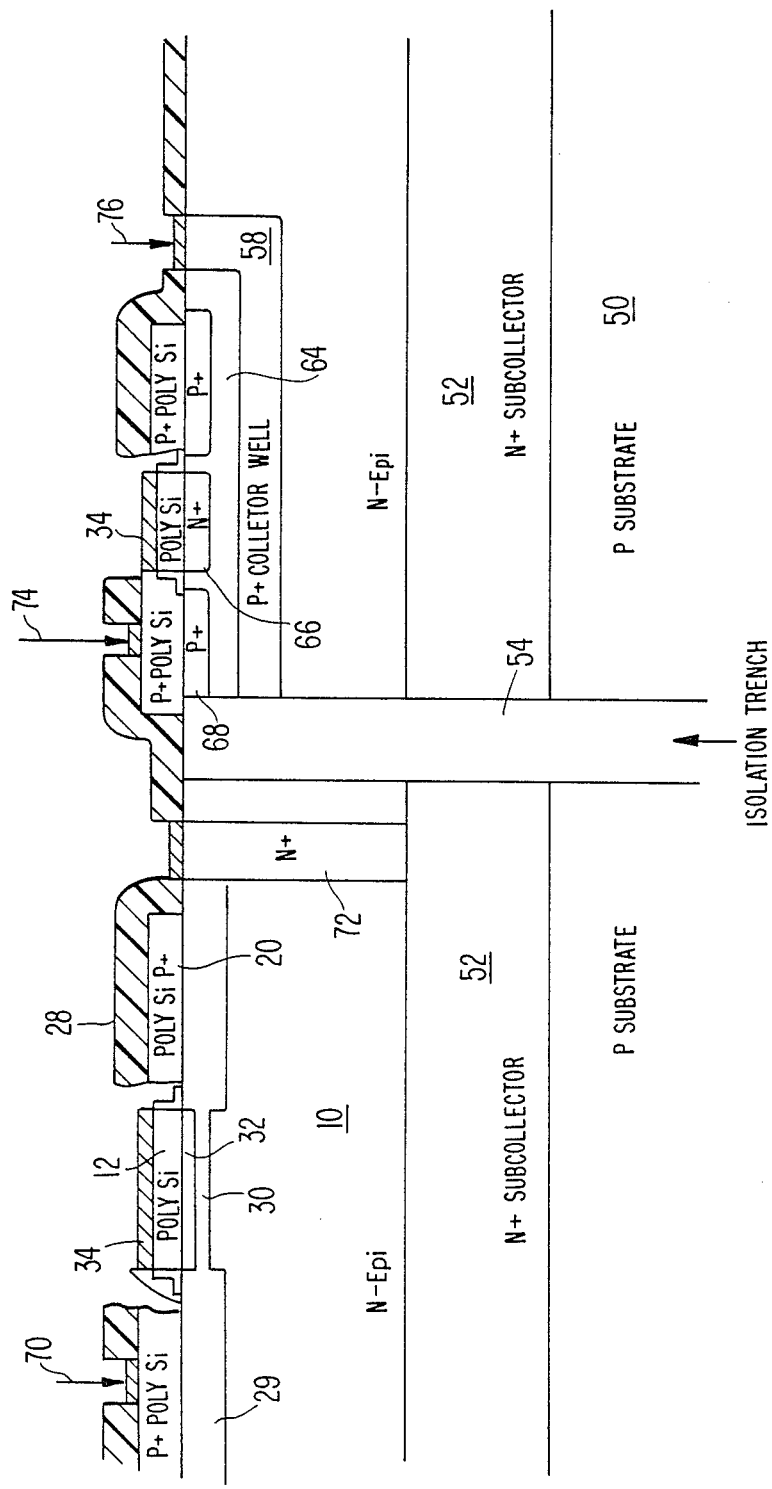
FIG. 3 shows a cross-section of the NPN and vertical PNP devices fabricated by the processes shown in FIGS. 1A through 1G and FIGS. 2A through 2B.

FIG. 3 shows a cross section of the NPN and vertical PNP devices made by the compatible process of the present invention. A base contact 70 and a reach through 72 are shown as the contact structures for the base region 29 and collector 10 and subcollector region 52, respectively, of the NPN device. An emitter contact 74 and collector contact 76 are shown for the PNP device. The contacts 70, 72, 74 and 76 may be made by standard metallization processes.

The present invention provides an improved process for fabricating high performance, the NPN bipolar devices using only two masking steps for the entire emitter/base and an additional 2 masking steps prior to forming the other active areas of the device for an entirely integrated PNP and NPN devices.

This sequence protects the surface of the crystal during deleterious etching steps which are prone to introduce contaminants and/or crystal damage. In particular, the absence of ion etching in the emitter regions has been found to reduce emitter contact resistance and emitter base leakage due to silicon surface modifications by shallow implanted impurity ions. The chemical-mechanical polishing process with the nitride regions serving as etch stops and the oxide sidewalls provide a self-alignment mechanism for forming emitter and base regions at narrow controllable spacings for high performance devices.

Although a specific embodiment of the invention has been disclosed, it will be understood by those having skill in the art that changes can be made in the specific embodiment without departing from the spirit and scope of the invention.

What is claimed is:

1. A process for forming a bipolar device having a self-aligned emitter region which includes a surface not subjected to deleterious processes during the formation of other active regions in the device comprising the steps of, forming an epi-layer on a substrate to be of a first conductivity type suitable as a collector region, forming and defining first and second overlying insulating layers of different materials at a selected point on the epi-layer for a future emitter region of the device, forming and controlling a linking region of a second conductivity type in the epi-layer to be adjacent to the future emitter region, forming and defining an insulating layer of a third isolating material on the layer as a sidewall surrounding the first and second overlying layers, the sidewall serving as a mask for aligning subsequent and sequentially formed emitter and intrinsic base regions, depositing and planarizing a layer of a fourth insulating material to expose the second insulating layer overlying the future emitter region, implanting through the deposited and planarized fourth insulating material the second conductivity type to form an extrinsic base region therebeneath, the exposed second insulating layer serving as a mask to the second conductivity type, removing the exposed second insulating layer to expose the first insulating layer overlying the future emitter region, implanting into the exposed first insulating layer, the second conductivity type and heating the substrate to drive the second conductivity into the epi-layer to serve as an intrinsic base region which is connected to the extrinsic base region through the linking region, implanting the first conductivity type into the first exposed layer and heating the substrate to drive-in the first conductivity type to form an emitter region disposed within the intrinsic base region, and forming metal connections to the emitter, base and collector regions whereby the device has enhanced performance due to the absence of deleterious processes affecting the surface of the layer overlying the emitter and linking regions.

2. The process of claim 1 wherein a chemical-mechanical process planarizes the fourth insulating material and the first insulating layer serves as a polishing stop.

3. The process of claim 2 wherein the metal is selected to form a schottky barrier diode contact.

4. The process of claim 2 wherein the first insulating layer is undoped polysilicon, the second insulating layer is silicon nitride, the third insulating layer is silicon dioxide and the fourth insulating layer is in situ doped polysilicon.

5. The process of claim 2 wherein the step of forming and defining a linking region includes the steps of forming a layer of thermal oxide and implanting therein the second conductivity type.

6. The process of claim 2 wherein the steps of forming a sidewall including defining the sidewall to overly the linking region.

7. The process of claim 1 wherein a second bipolar device of opposite conductivity type is formed in the substrate by first performing the following steps:

forming a dielectric insulation region in the epi-layer of a first conductivity type to establish first and second regions therein, which are electrically and physically isolated from each other, forming a photoresist layer across the surface of the epi-layer, patterning the photoresist layer to implant a second conductivity type in the second regions of the epi-layer to convert the first conductivity type therein and establish a collector region for a second device, and reforming and patterning the photoresist layer to implant the first conductivity in the second region to serve as a base region for the second device.

8. The process of claim 7 wherein the emitter region is formed for the second device at the same time the extrinsic region is formed for the bipolar device.

9. The process of claim 8 wherein a base contact is formed for the second device at the same time the emitter region is formed for the bipolar device.

10. The process of claim 9 wherein the bipolar device is an NPN type and the second device is a PNP type.

11. The process of claim 1 wherein the linking region extends beneath the insulating layer surrounding the future emitter region.

12. The process of claim 11 including the further step of selectively etching the third material to lower the surface of epi layer relative to the surface of the future emitter region thereby facilitating the formation of the emitter-extrinsic base connection through the linking region.

13. The process of claim 12 wherein the linkup region and future emitter region are permanently protected from ion implantation processes by the first layer and the insulating region surrounding the future emitter region.

14. A process for forming a bipolar device having a self-aligned emitter region which includes a surface not subjected to deleterious processes during the formation of other active regions in the device comprising the steps of, forming an epi layer on a substrate to be of a first conductivity type suitable as a collector region, forming and defining first and second overlying insulating layers of different materials at a selected point on the epi layer for a future emitter region of the device, converting a portion of the first layer by thermal means into an insulating region surrounding the future emitter region, forming and controlling a linking region of a second conductivity type in the epi layer to extend beneath the surrounding insulating region and be adjacent to the future emitter region, forming and defining an insulating layer of a third isolating material on the layer as a sidewall surrounding the first and second overlying layers, the sidewall serving as a mask for aligning subsequent and sequentially formed emitter and intrinsic base regions, depositing and planarizing a layer of a fourth insulating material to expose the second insulating layer overlying the future emitter region, implanting through the deposited and planarized fourth insulating material the second conductivity type to form an extrinsic base region there beneath, the exposed second insulating layer serving as a mask to the second conductivity type, removing the exposed second insulating layer to expose the first insulating layer overlying the future emitter region, implanting into the exposed first insulating layer, the second conductivity type and heating the substrate to drive the second conductivity into the epi layer to serve as an intrinsic base region which is connected to the extrinsic base region through the linking region, and implanting the first conductivity type into the first exposed layer and heating the substrate to drive-in the first conductivity type to form an emitter region disposed within the intrinsic base region, the linkup region and emitter region being permanently protected from ion implantation processes by the first layer and the surrounding insulating region during ion implantation processing.

* * * * *